(12) United States Patent
Kim et al.

(10) Patent No.: US 9,478,348 B2
(45) Date of Patent: Oct. 25, 2016

(54) VERTICAL SPIRAL INDUCTOR

(71) Applicant: QUALCOMM Incorporated, San Diego, CA (US)

(72) Inventors: Daeik Daniel Kim, San Diego, CA (US); Changhan Hobie Yun, San Diego, CA (US); Mario Francisco Velez, San Diego, CA (US); Chengjie Zuo, Santee, CA (US); David Francis Berdy, San Diego, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/313,241

(22) Filed: Jun. 24, 2014

(65) Prior Publication Data

US 2015/0371751 A1 Dec. 24, 2015

(51) Int. Cl.
| | |
|---|---|
| *H01F 5/00* | (2006.01) |
| *H01F 27/29* | (2006.01) |
| *H01F 7/06* | (2006.01) |
| *H01F 27/28* | (2006.01) |
| *H01F 41/04* | (2006.01) |
| *H01F 17/00* | (2006.01) |
| *H01L 23/64* | (2006.01) |
| *H01L 49/02* | (2006.01) |
| *H01L 23/15* | (2006.01) |

(52) U.S. Cl.
CPC ...... *H01F 27/2804* (2013.01); *H01F 17/0013* (2013.01); *H01F 41/04* (2013.01); *H01L 23/645* (2013.01); *H01L 28/10* (2013.01); *H01F 2017/002* (2013.01); *H01F 2017/0073* (2013.01); *H01F 2017/0086* (2013.01); *H01L 23/15* (2013.01); *H01L 2924/0002* (2013.01); *Y10T 29/49075* (2015.01)

(58) Field of Classification Search
CPC .... H01F 27/28; H01F 27/2804; H01F 41/04; H01F 41/041; H01F 17/0006; H01F 17/0013
USPC .......................... 336/200, 223, 192; 29/606
See application file for complete search history.

(56) References Cited

U.S. PATENT DOCUMENTS

| | | |
|---|---|---|
| 6,611,188 B2 | 8/2003 | Yeo et al. |
| 7,170,384 B2 | 1/2007 | Kim et al. |

(Continued)

OTHER PUBLICATIONS

International Search Report and Written Opinion—PCT/US2015/034220—ISA/EPO—Nov. 5, 2015.

*Primary Examiner* — Mangtin Lian
(74) *Attorney, Agent, or Firm* — Muncy, Geissler, Olds & Lowe, P.C.

(57) ABSTRACT

Methods and apparatuses, wherein the method forms a first plurality of vias in a substrate, further comprising forming the first plurality of vias to be substantially the same height. The method forms a plurality of conductive traces external to the substrate and couples the plurality of conductive traces to the first plurality of vias: wherein the plurality of conductive traces and the first plurality of vias comprise a plurality of conductive turns and wherein the plurality of conductive turns are in a spiral configuration substantially within a first plane.

18 Claims, 8 Drawing Sheets

(56) References Cited

U.S. PATENT DOCUMENTS

| | | |
|---|---|---|
| 7,339,452 B2 | 3/2008 | Lee |
| 7,733,207 B2 | 6/2010 | Yun et al. |
| 7,986,211 B2 | 7/2011 | Kim et al. |
| 2007/0268105 A1* | 11/2007 | Walls .................. H01F 17/0013 336/200 |
| 2008/0231402 A1 | 9/2008 | Jow et al. |
| 2008/0297299 A1* | 12/2008 | Yun ..................... H01F 17/0013 336/200 |
| 2011/0140825 A1* | 6/2011 | Kim .................... H01F 17/0006 336/207 |
| 2011/0170231 A1 | 7/2011 | Chandrasekaran et al. |
| 2011/0291786 A1* | 12/2011 | Li .......................... H01F 21/08 336/200 |

\* cited by examiner

VERTICAL SPIRAL INDUCTOR

BACKGROUND OF THE INVENTION

1. Field of the Invention

Disclosed embodiments relate to three-dimensional inductors.

2. Description of the Related Art

An inductor usually consists of a coil of conducting material, typically insulated copper wire, wrapped around a core either of plastic or of a ferromagnetic material; the latter is called an "iron core" inductor. The high permeability of the ferromagnetic core increases the magnetic field and confines it closely to the inductor, thereby increasing the inductance. Low frequency inductors are constructed like transformers, with cores of electrical steel laminated to prevent eddy currents. "Soft" ferrites are widely used for cores above audio frequencies, since they do not cause the large energy losses at high frequencies that ordinary iron alloys do. Inductors come in many shapes. Most are constructed as enamel coated wire (magnet wire) wrapped around a ferrite bobbin with wire exposed on the outside, while some enclose the wire completely in ferrite and are referred to as "shielded". Some inductors have an adjustable core, which enables changing of the inductance. Inductors used to block very high frequencies are sometimes made by stringing a ferrite bead on a wire. Small inductors can be etched directly onto a printed circuit board by laying out the trace in a spiral pattern. Some such planar inductors use a planar core.

FIG. 1 shows a top view of a conventional spiral multi-turn inductor 100. The inputs of the spiral multi-turn inductor 100 can have polarity due to the lack of symmetry. Since the inductance value of the inductor 100 can be proportional to the total series metal length used to form the inductor 100, the inductance value can be affected by the width of the metal conductor forming the inductor turns, the space between the turns, the diameter of the metal conductor and the number of turns in the spiral. As shown in FIG. 1, the inputs to the inductor 100 can be on opposite sides of the structure. The inputs can be brought out to the same side of the inductor structure. The spiral multi-turn inductor 100 includes a multi-turn spiral portion 102, a first input 104 and a second input 106 which is brought out from the spiral ending point 108 to the opposite side of the inductor 100 from the first input 104. A lead 110 is used to bring the second input 106 out from the spiral ending point 108 of the inductor 100. The spiral multi-turn inductor 100 also has overlap regions 112 and 114 due to its multi-turn portion 102 crossing the lead 110 which can cause capacitive coupling between the layers. The capacitive coupling of these overlap regions 112, 114 can degrade the performance of the inductor 100. Further, the area of the inductor 100 can be proportional to a required quality factor.

FIG. 2 illustrates a perspective-view of a conventional three-dimensional solenoid inductor 200. The three-dimensional inductor 200 comprises series of conductive traces 204 and bonds 206 forming a continuous conductive path from a first port 208 to a second port 210 of the inductor 200. The exemplary three-dimensional inductor 200 has two loops formed by the bonds 206 and the conductive traces 204 forming a solenoid-like shape. A three-dimensional inductor of this structure can have more or less loops as desired. Passing a current through the inductor 200 forms an electromagnetic field in the area within the loops. A three-dimensional solenoid can be limited to reduce area.

SUMMARY

The disclosure is directed to a vertical spiral inductor.

An inductor can comprise a first plurality of vias, wherein each of the first plurality of vias through a substrate being substantially the same height. The inductor can comprise a plurality of conductive traces external to the substrate interconnecting the first plurality of vias, wherein the plurality of conductive traces and the first plurality of vias comprise a plurality of conductive turns, and wherein the plurality of conductive turns are in a spiral configuration substantially within a first plane A method can form a first plurality of vias in a substrate, further comprising forming the first plurality of vias to be substantially the same height. The method can form a plurality of conductive traces external to the substrate. The method can couple the plurality of conductive traces to the first plurality of vias, wherein the plurality of conductive traces and the first plurality of vias comprise a plurality of conductive turns, and wherein the plurality of conductive turns are in a spiral configuration substantially within a first plane.

An inductor, comprising a first plurality of vias, wherein each of the first plurality of vias through a substrate being substantially the same height. The inductor can comprise a second plurality of vias, wherein the second plurality of vias are external to the substrate. The inductor can comprise a plurality of conductive traces interconnecting the second plurality of vias, wherein the plurality of conductive traces, the first plurality of vias, and the second plurality of vias comprise a plurality of conductive turns, and wherein the plurality of conductive turns are in a spiral configuration substantially within a first plane.

A vertical spiral inductor can increase area efficiency in multiple-stack substrates. Such an inductor can include a horizontally-defined magnetic field. This field can minimize interaction to and from vertical integration with regard to a silicon substrate and a printed circuit board (PCB).

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

DETAILED DESCRIPTION

Various aspects are disclosed in the following description and related drawings. Alternate aspects may be devised without departing from the scope of the disclosure. Additionally, well-known elements of the disclosure will not be described in detail or will be omitted so as not to obscure the relevant details of the disclosure.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the disclosure" does not require that all aspects of the disclosure include the discussed feature, advantage or mode of operation.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

Figure 1:
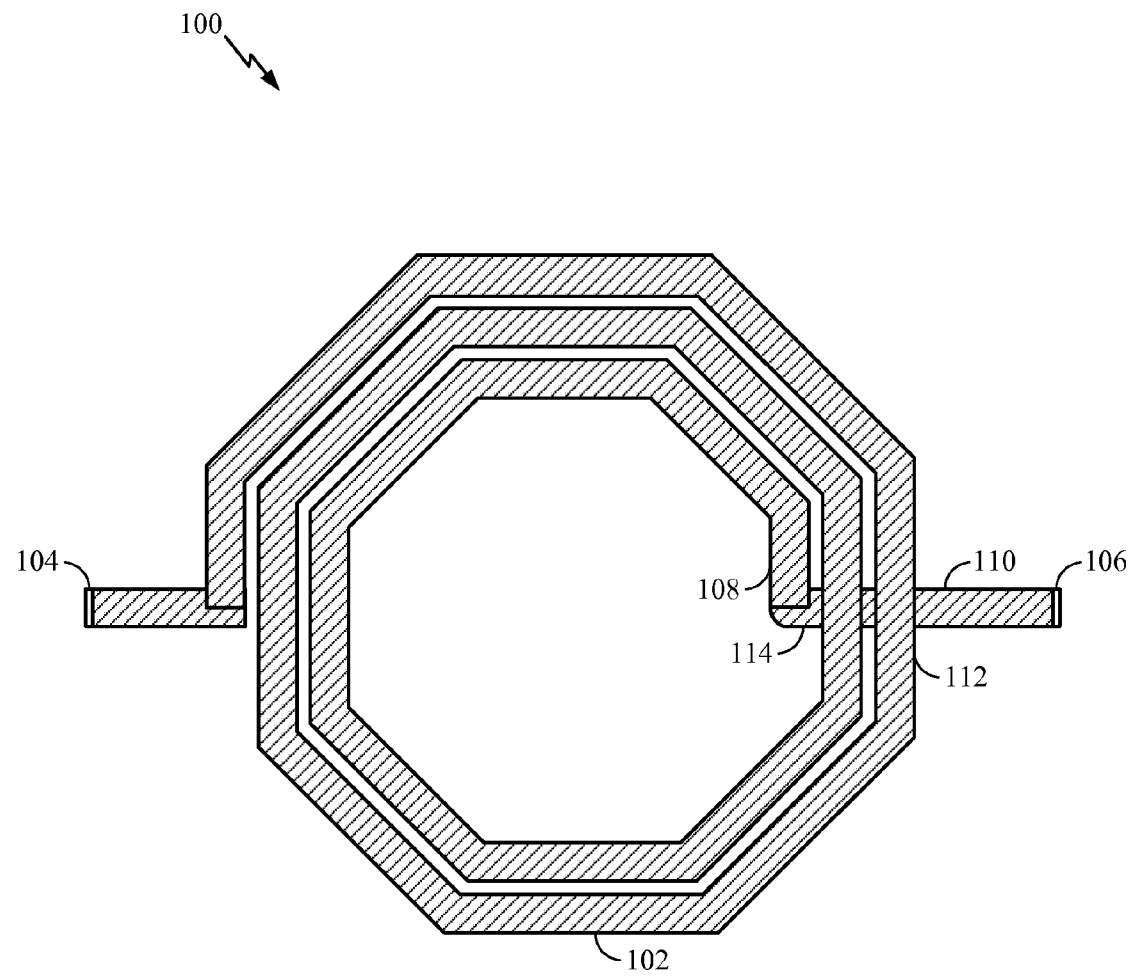
FIG. 1 illustrates a top view of a conventional spiral multi-turn inductor.
Figure 2:
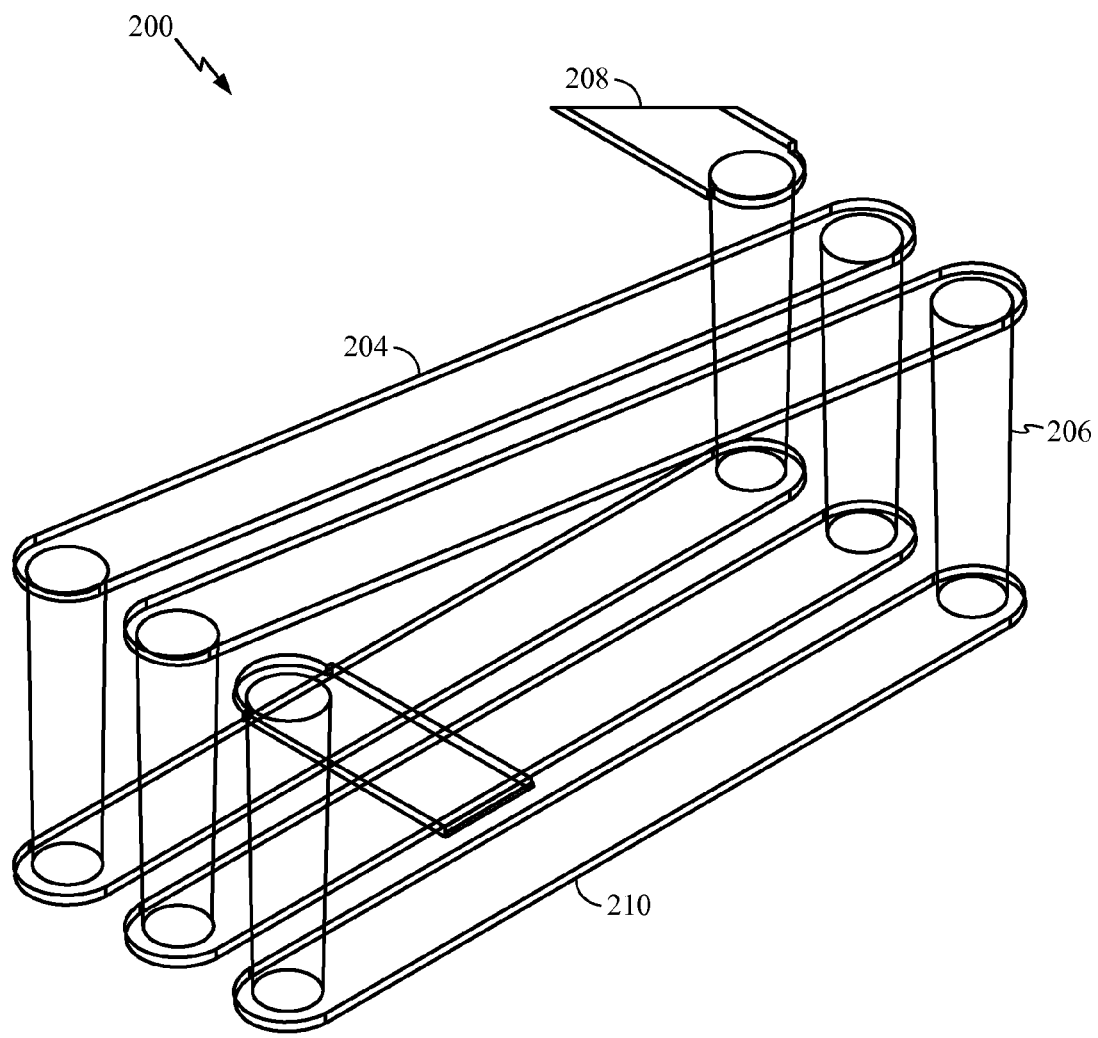
FIG. 2 illustrates a perspective-view of a conventional three-dimensional solenoid inductor.
Figure 3:
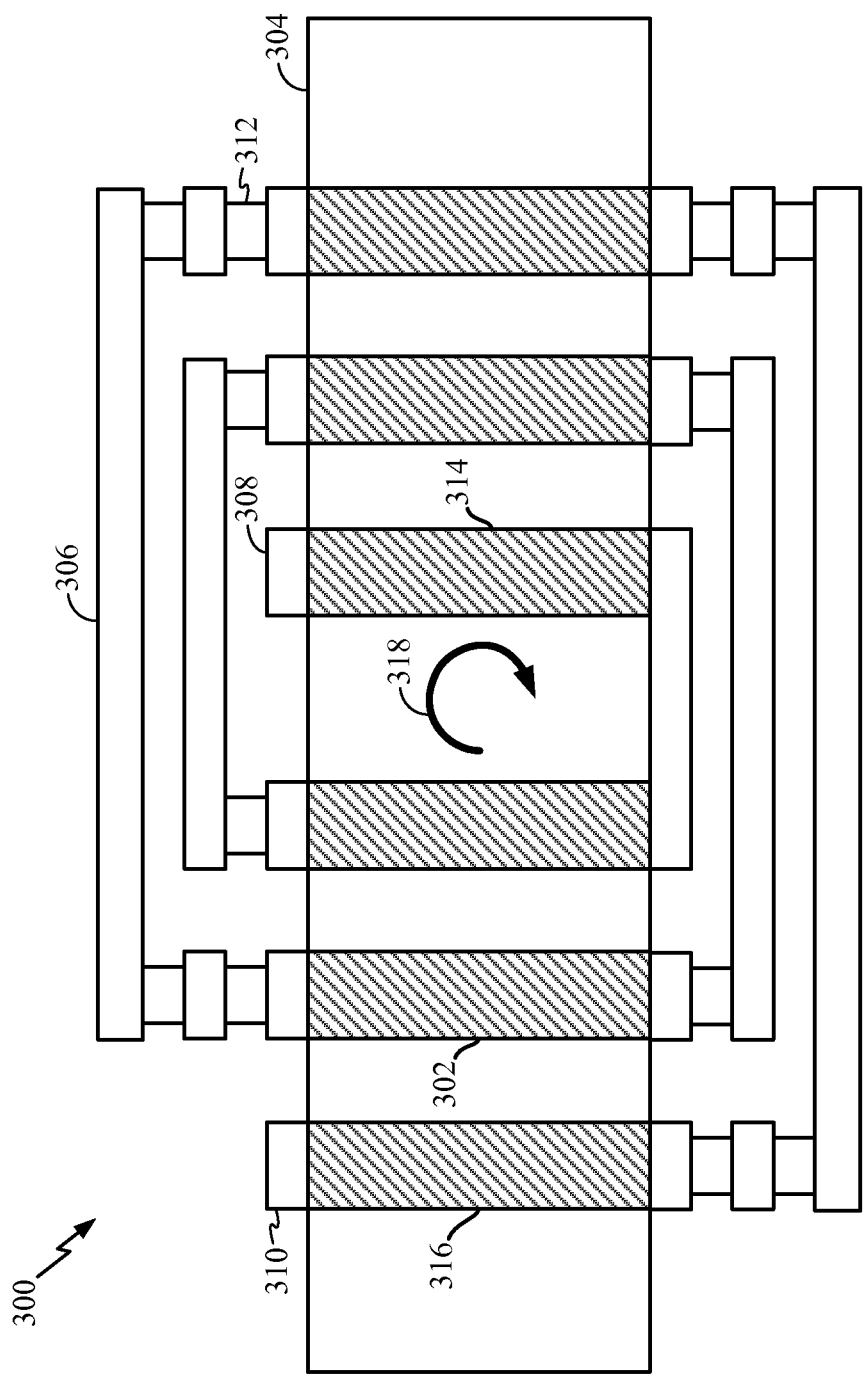
FIG. 3 illustrates a side view of an embodiment of a vertical spiral inductor.

FIG. 3 illustrates a side view of an embodiment of a vertical spiral inductor 300. The inductor 300 includes a first plurality of vias 302. As shown, the first plurality of vias 302 are formed through a substrate 304. In some embodiments, the first plurality of vias 302 can be substantially the same height. The inductor 300 is shown with a plurality of conductive traces 306 external to the substrate. The conductive traces 306 can interconnect the first plurality of vias 302, forming a plurality of conductive turns. In some embodiments, the conductive turns can be in a spiral configuration substantially within a first plane. In some embodiments, a first lead out 308 and a second lead out 310 can be in a second plane. For example, the second plane can be perpendicular to the first plane. In some embodiments, the first lead out 308 is coupled to a first via 314 of the first plurality of vias 302 with a subset of the plurality of vias 302 adjacent, and the second lead out 310 is connected to a second via 316 with one via adjacent.

In some embodiments, the inductor 300 can include a second plurality of vias 312. As show in FIG. 3, the second plurality of vias 312 can be external to the substrate 304. In some embodiments, the plurality of conductive traces 306 can be coupled to the first plurality of vias 302 by the second plurality of vias 312. In some embodiments, the inductor 200 can create a horizontally-defined magnetic field. This can minimize interaction to and from vertical integration. For example, the horizontally-defined magnetic field can reduce interaction with regard to a silicon substrate and a printed circuit board (PCB).

Figure 4A:
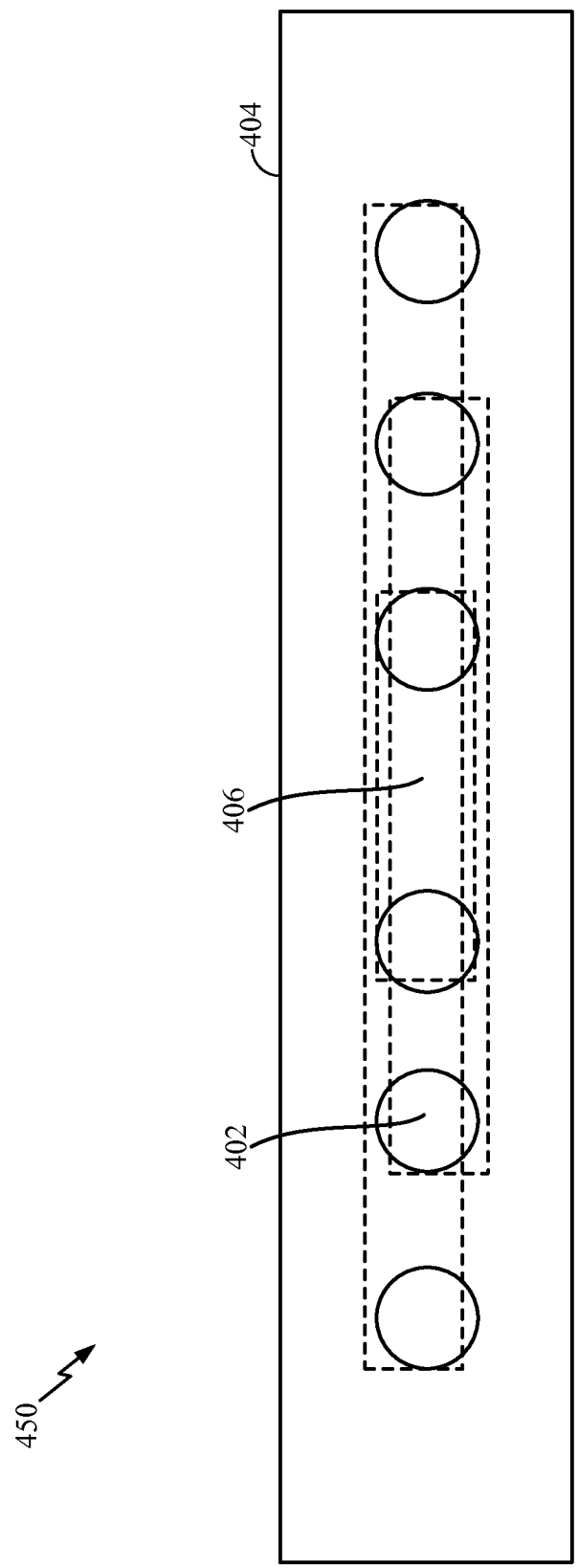
FIG. 4A illustrates a top view of an embodiment of a vertical spiral inductor.

FIG. 4A illustrates a top view of an embodiment of a vertical spiral inductor 400. The inductor 400 can include a first plurality of vias 402 that pass through a substrate 404. The first plurality of vias 402 can be coupled with a plurality of conductive traces 406. In some embodiments, at least one conductive trace of the plurality of conductive traces 406 can be substantially in one dimension.

Figure 4B:
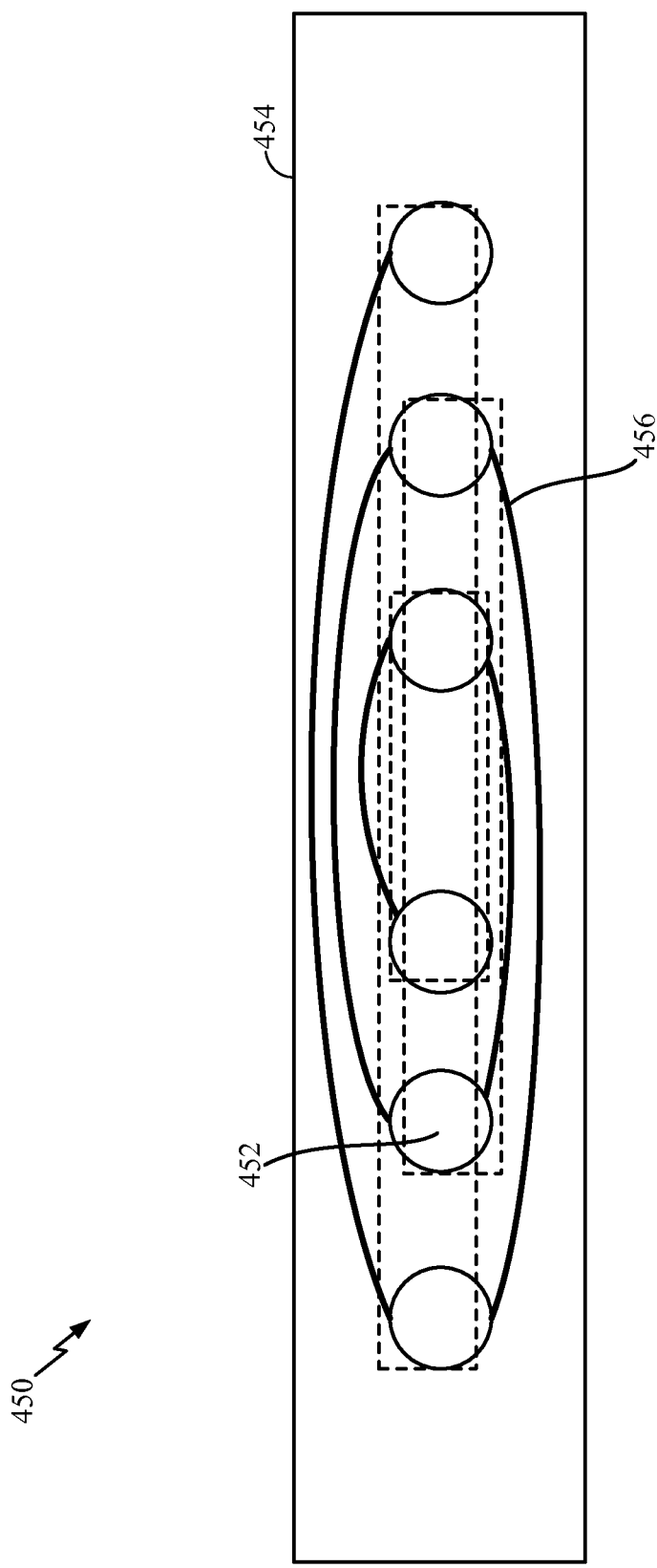
FIG. 4B illustrates a top view of an embodiment of a vertical spiral inductor.

FIG. 4B illustrates a top view of an embodiment of a vertical spiral inductor 450. The inductor 450 can include a first plurality of vias 452 that pass through a substrate 454. The first plurality of vias 452 can be coupled with a plurality of conductive traces 456. In some embodiments, wherein the at least one conductive trace of the plurality of conductive traces 456 is routed around at least one via of the first plurality of vias 452 in the first plane. In some embodiments, wherein the at least one conductive trace of the plurality of conductive traces 456 is routed around at least two vias of the first plurality of vias 452 in the first plane.

Figure 5:
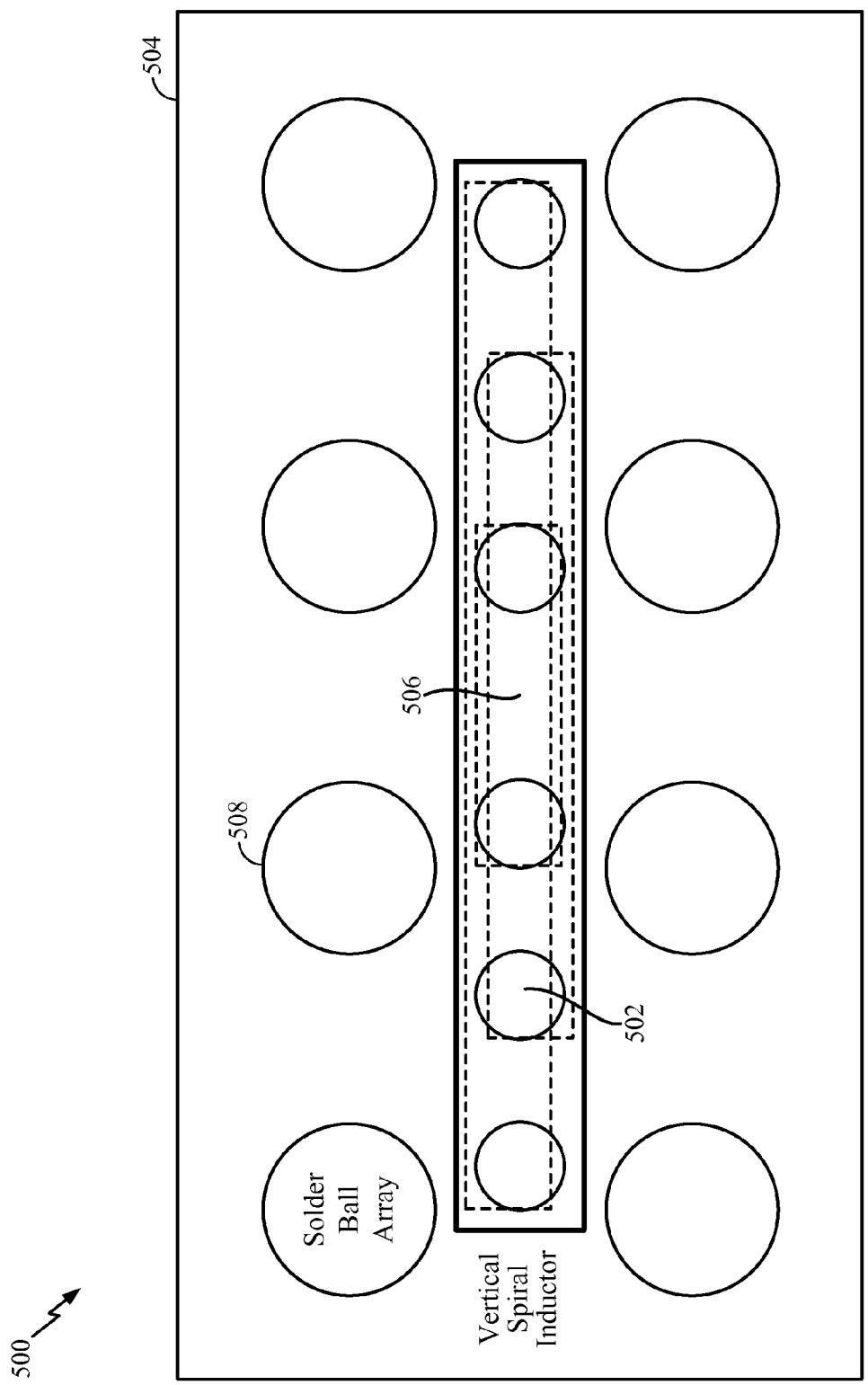
FIG. 5 illustrates a top view of an embodiment of a vertical spiral inductor within a solder ball array.

FIG. 5 illustrates a top view of an embodiment of a vertical spiral inductor 500 within a solder ball array 508. The inductor 500 can include a first plurality of vias 502 that pass through a substrate 504. The first plurality of vias 502 can be coupled with a plurality of conductive traces 506. As shown in FIG. 5, the inductor 500 can be positioned between at least two rows of the ball array 508.

Figure 6:
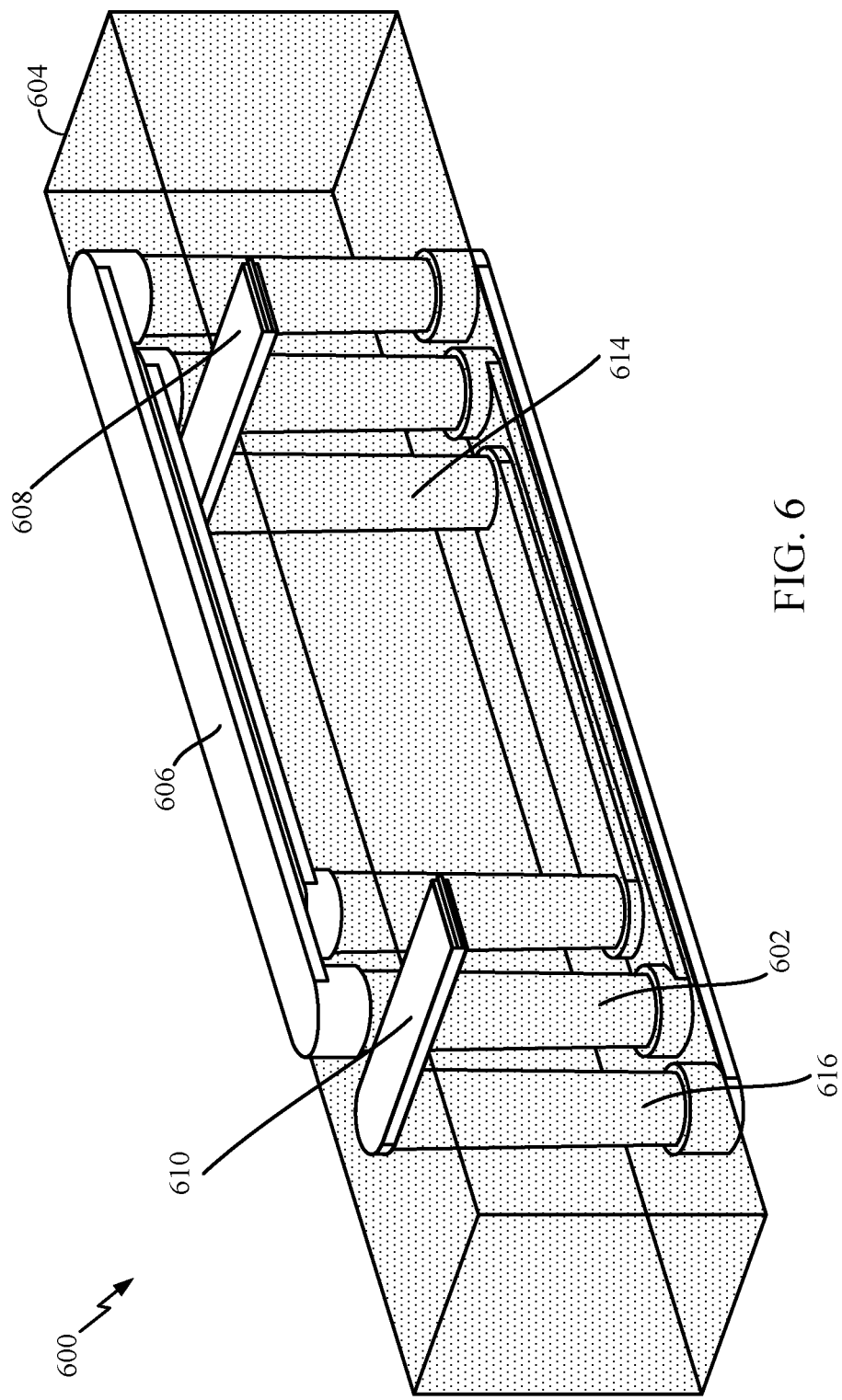
FIG. 6 illustrates a perspective-view of an embodiment of a vertical spiral inductor.

FIG. 6 illustrates a perspective-view of an embodiment of a vertical spiral inductor 600. The inductor 600 can include a first plurality of vias 602 that pass through a substrate 604. The first plurality of vias 602 can be coupled with a plurality of conductive traces 606 to form a plurality of conductive turns. In some embodiments, the substrate 604 is comprised of at least one of glass or silicon. In some embodiments, the inductor can include a printed circuit board. In some embodiments, the conductive turns can be in a spiral configuration substantially within a first plane. In some embodiments, a first lead out 608 and a second lead out 610 can be in a second plane. For example, the second plane can be perpendicular to the first plane. In some embodiments, the first lead out 608 is coupled to a first via 614 of the first plurality of vias 602 with a subset of the plurality of vias 602 adjacent, and the second lead out 610 is connected to a second via 616 with one via adjacent.

Figure 7:
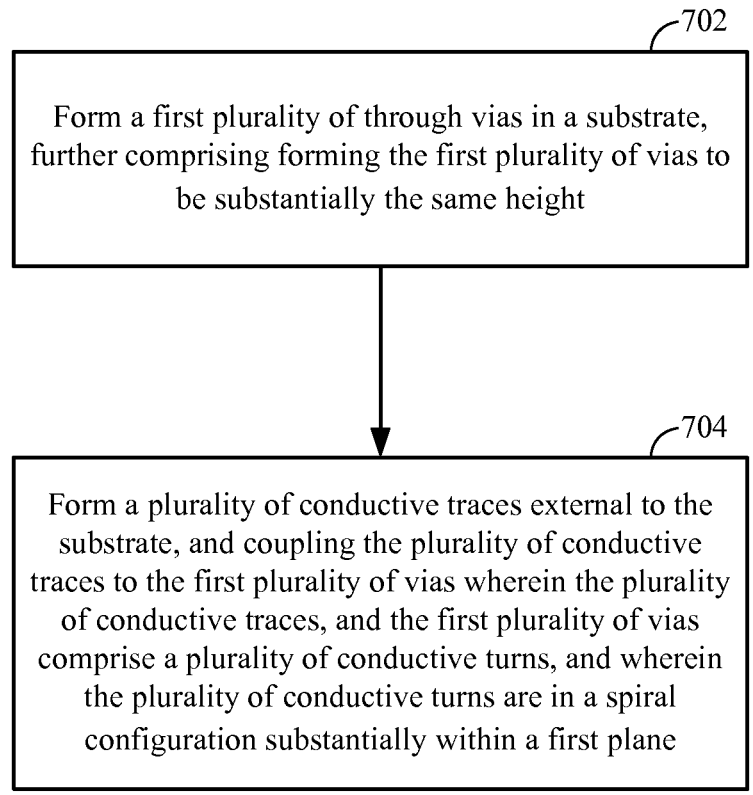
FIG. 7 illustrates an operational flow of a method.

FIG. 7 illustrates an embodiment that can include a method comprising: forming a first plurality of vias in a substrate (e.g., the first plurality of vias substantially the same height; wherein the first plurality of vias are within a ball array, wherein the first plurality of vias are positioned between at least two rows of the ball array), -Block 702; and forming a plurality of conductive traces external to the substrate, and coupling the plurality of conductive traces to the first plurality of vias (e.g., wherein the plurality of conductive traces, and the first plurality of vias comprise a plurality of conductive turns, and wherein the conductive turns are in a spiral configuration substantially within a first plane) wherein the plurality of conductive traces, and the first plurality of vias comprise a plurality of conductive turns, and wherein the plurality of conductive turns are in a spiral configuration substantially within a first plane (e.g., wherein the at least one conductive trace of the plurality of conductive traces is substantially in one dimension; wherein the at least one conductive trace of the plurality of conductive traces is routed around at least one via in the first plane; further comprising forming a plurality of lead out patterns to the plurality of conductive traces in a second plane, wherein the second plane is perpendicular to the first plane; the plurality of lead out patterns comprise a first lead out and a second lead out, wherein the first lead out is coupled to a first via with a plurality of vias adjacent, and the second lead out is connected to a second via with one via adjacent;) -Block 704.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods, sequences and/or algorithms described in connection with the aspects disclosed herein may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in an electronic object. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, DSL, or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes CD, laser disc, optical disc, DVD, floppy disk and Blu-ray disc where disks usually reproduce data magnetically, while discs reproduce data optically with lasers. Combinations of the above should also be included within the scope of computer-readable media.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. An inductor, comprising:
   a first plurality of vias through a substrate, wherein the first plurality of vias are substantially the same height; and
   a plurality of conductive traces external to the substrate interconnecting the first plurality of vias,
   wherein the plurality of conductive traces and the first plurality of vias comprise a plurality of conductive turns,
   wherein the plurality of conductive turns are in a spiral configuration substantially within a first plane,
   wherein the inductor further comprises a plurality of lead out patterns in a second plane perpendicular to the first plane, the plurality of lead out patterns comprising a first lead out and a second lead out,
   wherein the first lead out is coupled to a first via of the first plurality of vias, the first via adjacent to at least two other vias of the first plurality of vias, and
   wherein the second lead out is coupled to a second via of the first plurality of vias, the second via adjacent to one other via of the first plurality of vias.

2. The inductor of claim 1, further comprising a second plurality of vias external to the substrate, wherein the plurality of conductive traces are coupled to the first plurality of vias by the second plurality of vias.

3. The inductor of claim 1, wherein the inductor is within a ball array.

4. The inductor of claim 3, wherein the inductor is positioned between at least two rows of the ball array.

5. The inductor of claim 1, wherein the substrate is comprised of at least one of glass or silicon.

6. The inductor of claim 1, wherein at least one conductive trace of the plurality of conductive traces is substantially in one dimension.

7. The inductor of claim 1, wherein the at least one conductive trace of the plurality of conductive traces is routed around at least one via in the first plane.

8. The inductor of claim 7, wherein at least one conductive trace of the plurality of conductive traces is routed around at least two vias in the first plane.

9. The inductor of claim 1, further comprising a printed circuit board.

10. A method comprising:
forming a first plurality of vias in a substrate, further comprising forming the first plurality of vias to be substantially the same height; and
forming a plurality of conductive traces external to the substrate, and coupling the plurality of conductive traces to the first plurality of vias,
wherein the plurality of conductive traces and the first plurality of vias comprise a plurality of conductive turns,
wherein the plurality of conductive turns are in a spiral configuration substantially within a first plane, and
wherein the method further comprises:
forming a plurality of lead out patterns in a second plane perpendicular to the first plane, the plurality of lead out patterns comprising a first lead out and a second lead out;
coupling the first lead out to a first via of the first plurality of vias, the first via adjacent to at least two other vias of the first plurality of vias; and
coupling the second lead out to a second via of the first plurality of vias, the second via adjacent to one other via of the first plurality of vias.

11. The method of claim 10, further comprising forming a second plurality of vias external to the substrate, wherein coupling the plurality of conductive traces to the first plurality of vias is through the second plurality of vias.

12. The method of claim 10, further comprising forming the first plurality of vias within a ball array.

13. The method of claim 12, further comprising positioning the first plurality of vias between at least two rows of the ball array.

14. The method of claim 10, wherein the substrate is comprised of at least one of glass or silicon.

15. The method of claim 10, further comprising forming at least one conductive trace of the plurality of conductive traces in substantially one dimension.

16. The method of claim 10, further comprising routing the at least one conductive trace of the plurality of conductive traces around at least one via in the first plane.

17. The method of claim 16, further comprising routing at least one conductive trace of the plurality of conductive traces around at least two vias in the first plane.

18. An inductor, comprising:
a first plurality of vias through a substrate, wherein the first plurality of vias are substantially the same height;
a second plurality of vias coupled to the first plurality of vias, wherein the second plurality of vias are external to the substrate; and
a plurality of conductive traces interconnecting the second plurality of vias,
wherein the plurality of conductive traces, the first plurality of vias, and the second plurality of vias comprise a plurality of conductive turns,
wherein the plurality of conductive turns are in a spiral configuration substantially within a first plane,
wherein the inductor further comprises a plurality of lead out patterns in a second plane perpendicular to the first plane, the plurality of lead out patterns comprising a first lead out and a second lead out,
wherein the first lead out is coupled to a first via of the first plurality of vias, the first via adjacent to at least two other vias of the first plurality of vias, and
wherein the second lead out is coupled to a second via of the first plurality of vias, the second via adjacent to one other via of the first plurality of vias.

* * * * *